United States Patent
Dong et al.

(10) Patent No.: US 8,130,496 B2
(45) Date of Patent: Mar. 6, 2012

(54) DEVICE AND METHOD FOR MITIGATING RADIO FREQUENCY INTERFERENCE

(75) Inventors: Xiaopeng Dong, Hillsboro, OR (US); Mark MacDonald, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 185 days.

(21) Appl. No.: 12/416,833

(22) Filed: Apr. 1, 2009

(65) Prior Publication Data

US 2010/0254092 A1    Oct. 7, 2010

(51) Int. Cl.
*H05K 7/20* (2006.01)
*F28F 7/00* (2006.01)
*H01L 23/28* (2006.01)

(52) U.S. Cl. .............. 361/700; 361/719; 361/679.54; 361/704; 165/80.5; 165/104.33; 174/521; 174/526

(58) Field of Classification Search .......... 361/700, 361/679.53, 679.54; 165/80.5, 104.33, 185; 174/17 LF, 17 SF, 521, 526, 547
See application file for complete search history.

(56) References Cited

U.S. PATENT DOCUMENTS

| | | | |
|---|---|---|---|
| 4,673,520 A | 6/1987 | Hawe et al. | |
| 4,762,174 A * | 8/1988 | Artus | 165/185 |
| 5,007,478 A * | 4/1991 | Sengupta | 165/10 |
| 5,639,989 A | 6/1997 | Higgins, III | |
| 7,256,996 B2 * | 8/2007 | Egbert et al. | 361/695 |
| 2003/0142477 A1 * | 7/2003 | Elias et al. | 361/700 |
| 2005/0280987 A1 * | 12/2005 | Kwitek et al. | 361/687 |
| 2006/0099403 A1 * | 5/2006 | Johnson | 428/323 |
| 2008/0066890 A1 * | 3/2008 | Searls et al. | 165/104.21 |
| 2009/0021908 A1 * | 1/2009 | Patel et al. | 361/688 |

FOREIGN PATENT DOCUMENTS

WO    2010/120522 A2    10/2010
WO    2010/120522 A3    1/2011

OTHER PUBLICATIONS

International Search Report and Written Opinion. International Application No. PCT/US2010/029404, mailed Nov. 12, 2010. 9 pages.

* cited by examiner

*Primary Examiner* — Zachary M Pape
(74) *Attorney, Agent, or Firm* — Thorpe North & Western LLP

(57) ABSTRACT

Embodiments of the present invention describe a device and method of mitigating radio frequency interference (REI) in an electronic device. The electronic device comprises a housing, and a thermal energy storage material is formed in the housing. By increasing the loss tangent parameter of the thermal energy storage material, the REI of the electronic device is reduced.

23 Claims, 6 Drawing Sheets

DEVICE AND METHOD FOR MITIGATING RADIO FREQUENCY INTERFERENCE

BACKGROUND

1. Field

One or more embodiments of the present invention relate to the field of reducing radio frequency interference in electronic devices.

2. Discussion of Related Art

Radio frequency interference (RFI) is a common problem for electronic devices. Typically, an electronic device houses electronic components such as computational modules and radio modules for wired/wireless communications. RFI may originate from these electronic components or from external sources, which affects the signal integrity of communication signals transmitted/received by the electronic device.

Generally, electronic devices have a metallic enclosure for housing the electronic components. The metallic enclosure forms a resonant structure having resonant frequencies. These resonant frequencies are dependant on the form factor of the enclosure and the layout of the electronic components. If the resonant structure is excited and its resonant frequency falls into the transmission band, for example a wireless frequency band, the electronic device may experience severe RFI. Furthermore, small form factor devices such as Ultra Mobile Personal Computer (UMPC) aid Mobile Internet Device (MID) may experience a higher level of RFI due to the compact layout of their electronic components. Currently, there are several methods used to mitigate RFI. One method involves implementing an adaptive clock to shift the clock harmonics out of the operating radio frequencies. However, this method increases design complexity and costs.

BRIEF DESCRIPTION OF THE DRAWINGS

FIGS. 2B' and 2C' are cross-sectional views that illustrate the method of forming the thermal energy storage material in the electronic device in accordance with another embodiment of the present invention.

DETAILED DESCRIPTION

In the following description, numerous specific details are set forth in order to provide a thorough understanding of one or more embodiments of the present invention. In other instances, well known electronic device functionality and features have not been described in particular detail in order not to unnecessarily obscure this detailed description.

Embodiments of the present invention describe an electronic device comprising a thermal storage material for reducing radio frequency interference (RFI). The electronic device comprises a housing and a circuit board is disposed in the housing. A plurality of electronic components are mounted on the circuit board. The thermal energy storage material is formed in the housing and encapsulates the plurality of electronic components. The thermal energy storage material includes a plurality of conductive particles that increases the loss tangent parameter of the thermal energy storage material. The plurality of particles are added with a sufficient concentration level to increase the loss tangent but does affect the electrical insulating capability of the thermal energy storage material. By increasing the loss tangent of the thermal energy storage material, it significantly reduces the RFI experienced by the electronic device.

Figure 1:
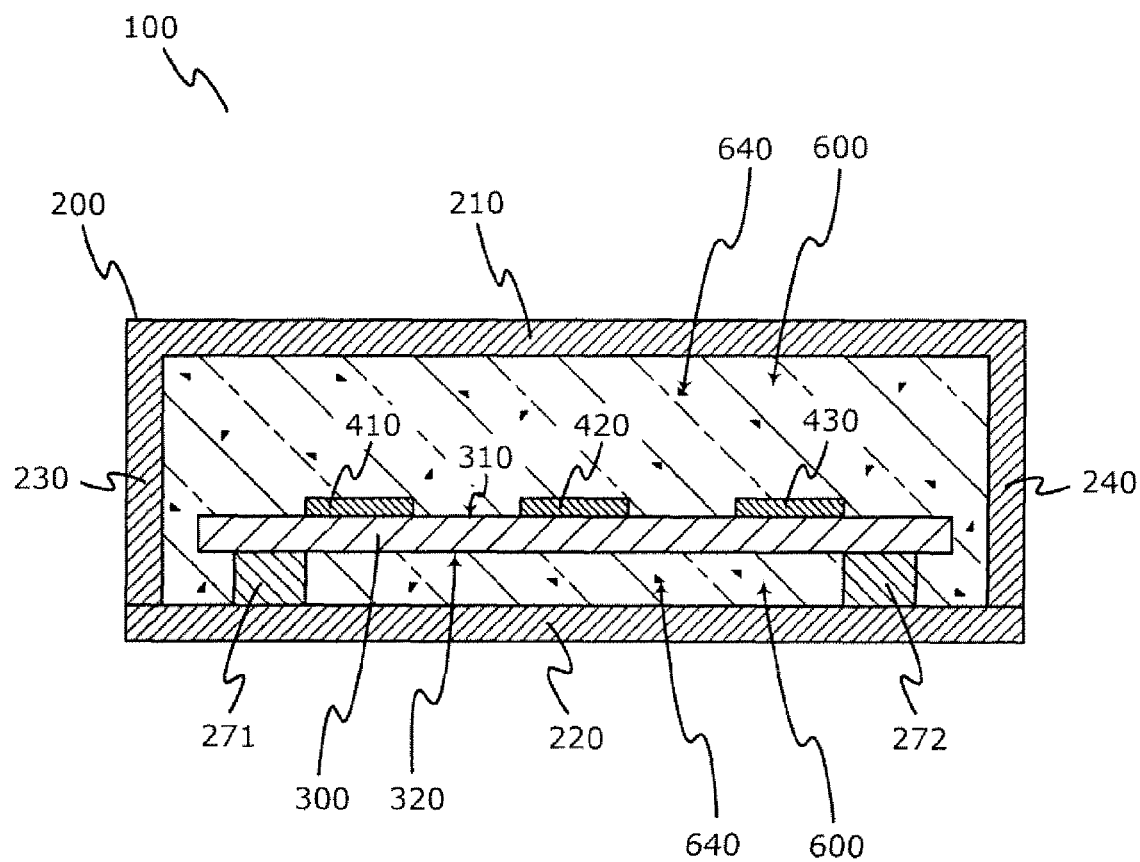
FIG. 1 is a cross-sectional view that illustrates an electronic device comprising a thermal energy storage material in accordance with one embodiment of the present invention.

FIG. 1 illustrates a cross-sectional view of the electronic device 100 in accordance with one embodiment of the present invention. The electronic device 100 can be any platform that has radio transmission capabilities, such as but not limited to wireless devices. Examples of wireless devices include mobile phones, Personal Digital Assistants (PDA), Mobile Internet Devices (MID), Ultra Mobile Personal Computers (UMPC), netbooks, and laptops.

In an embodiment of the present invention, the electronic device 100 comprises an enclosure or housing 200 including a top wall 210, a bottom wall 220, and a plurality of sidewalls 230, 240 extending from the periphery of the top wall 210 to the periphery of the bottom wall 220. In one embodiment the housing 200 is made of metal or metal alloys, such as but not limited to aluminum, magnesium and their alloys. In another embodiment, the housing 200 can be made of plastic materials, such as Acrylonitrile-butadiene-styrene (ABS). In the case where the housing 200 is made of plastic materials, the housing 200 includes an internal layer of metal film (not shown).

A circuit board 300 is disposed in the housing 200. In an embodiment of the present invention, the circuit board 300 is mounted onto supports 271, 272 at the bottom wall 220. The circuit board 300 uses any well known printed circuit board (PCB) and thus will not be discussed in detail. The circuit board 300 can be a single-sided circuit board, double-sided circuit board or stacked circuit board.

A plurality of electronic components 410, 420, 430 are mounted on the circuit board 300. In one embodiment, the plurality of electronic components 410, 420, 430 are mounted on the top surface 310 of the circuit board 300 as shown in FIG. 1. However, if the circuit board 300 is double-sided, the plurality of electronic components 410, 420, 430 can be mounted onto both the top and bottom surfaces 310, 320 of the circuit board 300. The plurality of electronic components 410, 420, 430 can be electrically interconnected by PCB traces well known in the art.

In one embodiment, the plurality of electronic components 410, 420, 430 include processor or controller modules, such as but not limited to a microprocessor, memory controller, graphics controller, and input/output controller. In one embodiment, the plurality of electronic components 410, 420, 430 further comprise volatile and non-volatile memory modules, such as but not limited to Dynamic Random Access Memory (DRAM) and hard-disk drives (HDD). In an embodiment of the present invention, the plurality of electronic components 410, 420, 430 include communication modules, such as but not limited to radio modules. Radio module refers to a radio transceiver that has the capability to operate in a communication protocol such as but not limited to Bluetooth, Ultra Wideband (UWB), Wireless Fidelity (WiFi) and Worldwide Interoperability for Microwave Access (WiMax). The WiMax and WiFi communication protocols are compatible with the Institute of Electrical and Electronics Engineers (IEEE) standards such as the IEEE 802.16 standard and the IEEE 802.11 standards that include but are not limited to IEEE 802.11a, IEEE 802.11b, and IEEE 802.11d.

In an embodiment of the present invention, a thermal energy storage material 600 is formed in the housing 300 to encapsulate the plurality of electronic components 410, 420, 430. In other words, the thermal energy storage material 600 is formed onto the top surface and sidewalls of the plurality of electronic components 410, 420, 430.

In one embodiment, the thermal energy storage material 600 is made from a material that has good electrical insulation and good thermal storage capabilities. During operation of the electronic device 100, the thermal energy storage material 600 absorbs and stores thermal energy or heat generated from the electronic components 410, 420, 430 or other internal heat sources such as the battery (not shown) of the electronic device 100. In other words, the thermal energy storage material 600 dissipates heat from the electronic components 410, 420, 430 and internal heat sources. The heat energy is stored in the thermal energy storage material 600 and is released after the electronic device 100 is powered down. Heat energy can be released back to the PCB 300 and electronic components 410, 420, 430 or released to the housing 200.

In addition, the thermal energy storage material 600 can be a phase change material. For example, when the electronic device is powered on, the phase change material experiences a temperature increase due to the heat generated from the electronic components 410, 420, 430 or other internal heat sources. The phase change material absorbs the generated heat and converts from a solid phase to a semi-solid or liquid phase, depending on the amount of heat generated. The phase change material, in its semi-solid or liquid phase, stores a substantial amount of the heat until the temperature is reduced, for example powering down the electronic device 100. When the temperature is lowered, the phase change material solidifies, upon which the stored heat is released. It can be appreciated that the phase change material is not limited to solid-to-liquid transitions or solid-to-semisolid transitions but may also include solid-solid transitions or liquid-liquid transitions.

In an embodiment of the present invention, the thermal energy storage material 600 is made from a material that comprises hydrocarbon groups having a chemical formula $C_nH_{2n+2}$. In a specific embodiment, the thermal energy storage material 600 is made of paraffin wax ($C_nH_{2n+2}$ where n>20). Paraffin wax is a phase change material with good electrical insulation and good thermal storage capabilities. In another embodiment, the thermal energy storage material 600 can be made of octadecane ($C_8H_{18}$) or eicosane ($C_{20}H_{42}$). In another embodiment, the thermal energy storage material 600 can be also be made from glycols, esters, or polymers. In an embodiment of the present invention, a high thermal conductive material, such as graphite, is added into the thermal energy storage material 600 to increase the thermal conductivity.

Apart from having good electrical insulation and good thermal storage properties, the thermal energy storage material 600 also includes the capability to dissipate electromagnetic energy. The term loss tangent is commonly used to refer to the parameter of a material in relation to its dissipation of electromagnetic energy. In an embodiment of the present invention, a plurality of conductive particles 640 are added or mixed with the thermal energy storage material 600 to increase the loss tangent of the thermal energy storage material 600. In other words, the plurality of conductive particles 640 are distributed in the thermal energy storage material 600 so as to increase the electrical conductivity of the thermal energy storage material 600. The plurality of conductive particles 640 have the capability to absorb electromagnetic energy and convert it into thermal energy, where the thermal energy is absorbed by the thermal energy storage material. As a result, the plurality of conductive particles 640 increases the loss tangent parameter of the thermal energy storage material 600, thus reducing RFI.

In an embodiment of the present invention, the plurality of conductive particles 640 are made of an electrically conductive material, such as but not limited to metals or metal alloys. For example, the plurality of conductive particles 640 are made of iron, copper, aluminum or silver. In one embodiment, the plurality of conductive particles 640 can be fabricated into any shapes and forms, such as but not limited to a flake or powder form. In one embodiment, the dimensions of the plurality of conductive particles 640 are relatively small compared to the thermal energy storage material 600. For example, the plurality of conductive particles can be around 50 to 100 micrometers in dimensions.

In one embodiment a sufficient amount of the plurality of conductive particles 640 is added to increase the electrical conductivity or loss tangent of the thermal energy storage material 600 without significantly affecting the thermal storage or electrical insulating properties of the thermal energy storage material 600. Furthermore, the amount of the plurality of conductive particles 640 added to the thermal energy storage material 600 does not significantly affect the electrical performance of the electronic device 100. In a particular embodiment, the plurality of conductive particles 640 have a volume concentration level ranging from 0.4 parts-per-million (ppm) to 1.0 ppm relative to the thermal energy storage material 600. Accordingly, the volume concentration level of the plurality of conductive particles 640 can be adjusted to achieve the desired loss tangent of the thermal energy storage material 600. In one embodiment, the plurality of conductive particles 640 does not chemically react with the thermal energy storage material 600.

In an alternative embodiment, the loss tangent or electrical conductivity of the thermal energy storage material 600 is increased by doping the thermal energy storage material 600 with conductive ions. In one embodiment the conductive ions chemically react with the molecules of the thermal energy storage material 600 and become chemically bonded with the molecules. In one embodiment, the conductive ions are made of a metallic material, such as but not limited to iron (Fe). In one embodiment, the conductive ions have a doping concentration level of ranging from 0.4 parts-per-million (ppm) to 1.0 ppm relative to the thermal energy storage material 600.

In a particular embodiment, the electronic device 100 comprises a housing 200 having dimensions of 9.5 cm by 4.5 cm by 1.0 cm (length×width×height), which forms a resonant frequency at around 2.5 GHz. This resonant frequency falls within the typical WiFi or WiMax frequency band used by the electronic device 100. In one embodiment, the thermal energy storage material 600 is made of paraffin wax, which has a loss tangent of about 0.0002. In one embodiment, a sufficient amount of the plurality of conductive particles 640 is added to the thermal energy storage material 600 to increase the loss tangent by a factor of 10. In a specific embodiment, the plurality of conductive particles 640 with a volume concentration level of around 0+4 ppm is added to the paraffin wax, which increases the loss tangent of the paraffin wax from 0.0002 to 0.002. By increasing the loss tangent of the thermal energy storage material 600 from 0.0002 to 0.002, the RFI is reduced by 4 times.

In addition, when the electronic device 100 is powered up, the plurality of electronic components 410, 420, 430 and other internal heat sources generates heat, which increases the temperature of the paraffin wax. The paraffin wax absorbs the generated heat and converts from a solid phase to a semi-solid or liquid phase. Typically, paraffin wax has a broad range of melting point ranging from 0 to 100 degree Celsius (° C.). In an embodiment of the present invention, the paraffin wax is made of docosane ($C_{22}H_{46}$) with a melting point of about 42 degree Celsius (° C.). If the paraffin wax undergoes a solid-liquid transition, the volume of the paraffin wax may increase or expand by 5% to 10%. However, the housing 200 has sufficient flexibility to absorb the volume expansion of the paraffin wax. In one embodiment, the housing 200 can be hermetically sealed so that paraffin wax, in its liquid phase, does not leak out of the housing 200. A substantial amount of the heat is stored by the paraffin wax until it temperature is reduced. For example, when the electronic device 100 is powered down and the temperature decreases, the paraffin wax releases the stored energy and solidifies.

Figure 2A:
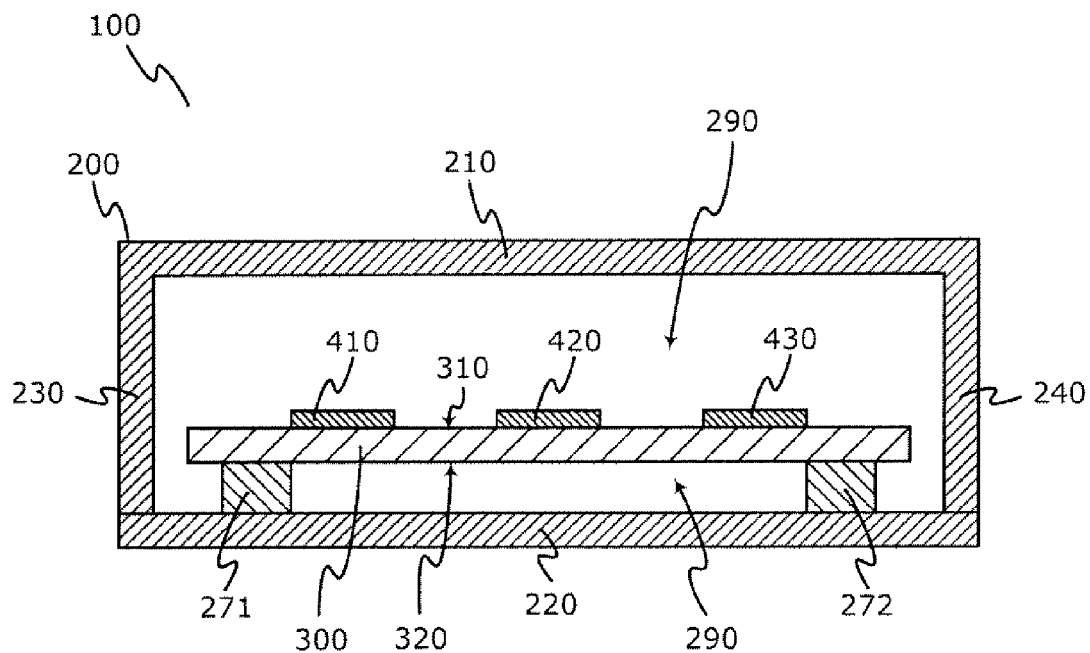
FIGS. 2A-2C are cross-sectional views that illustrate a method of forming the thermal energy storage material in the electronic device in accordance with one embodiment of the present invention.
Figure 2B:
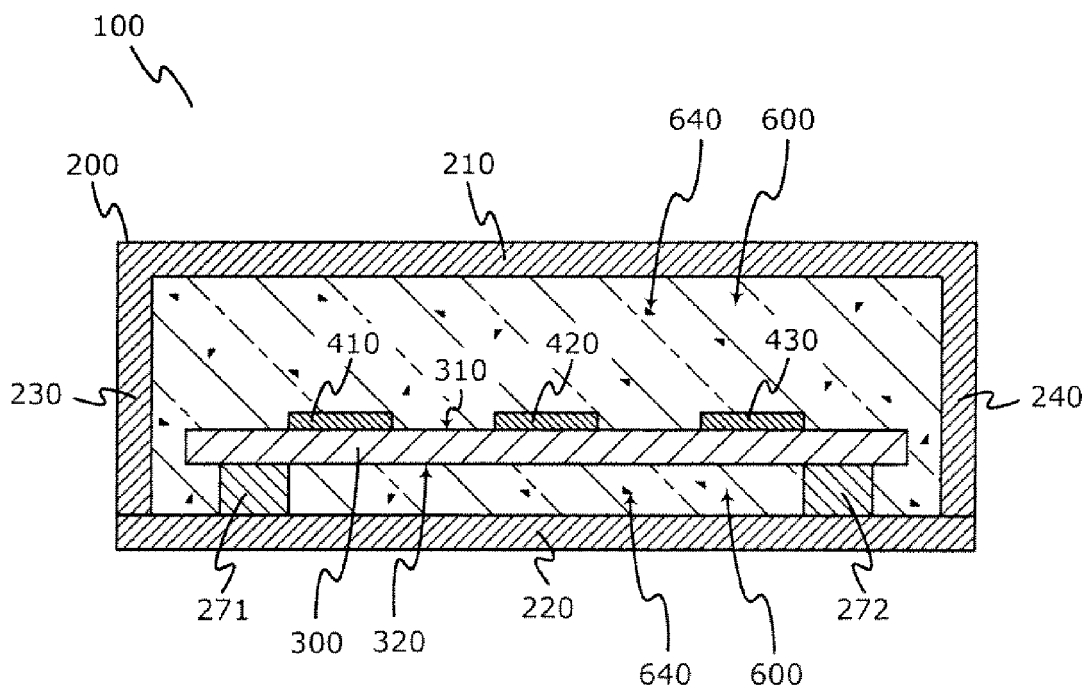
Figure 2B:
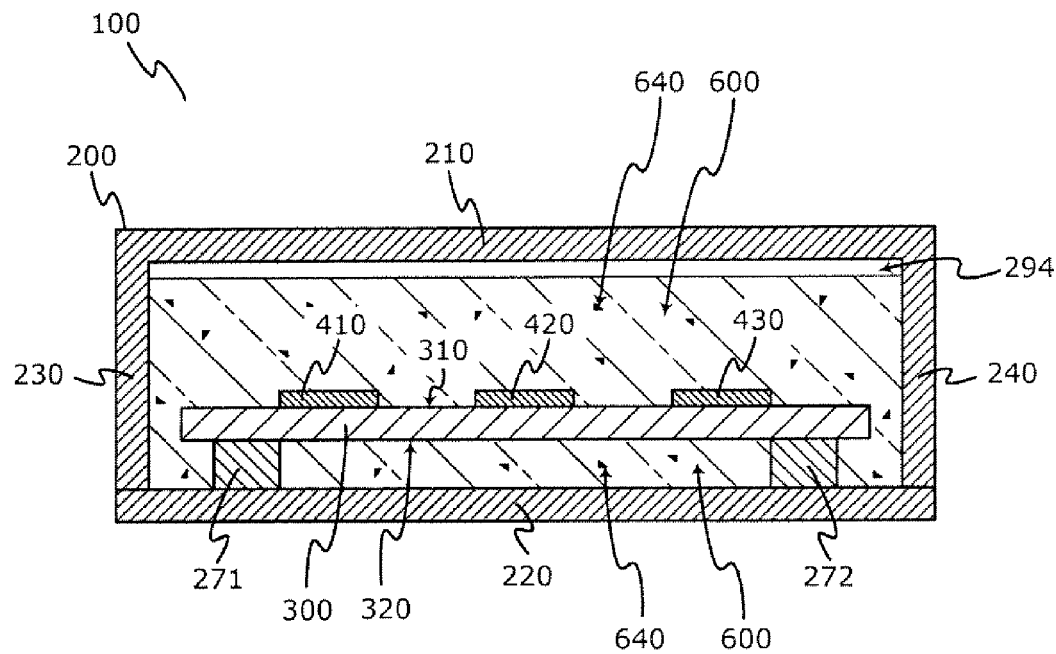
Figure 2C:
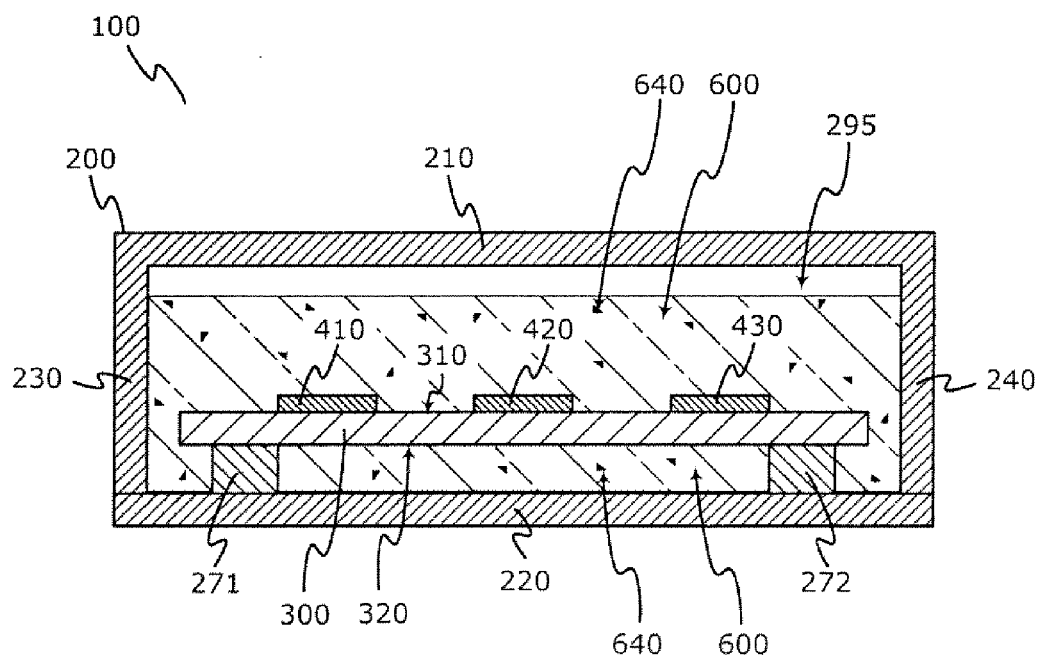
Figure 2C:
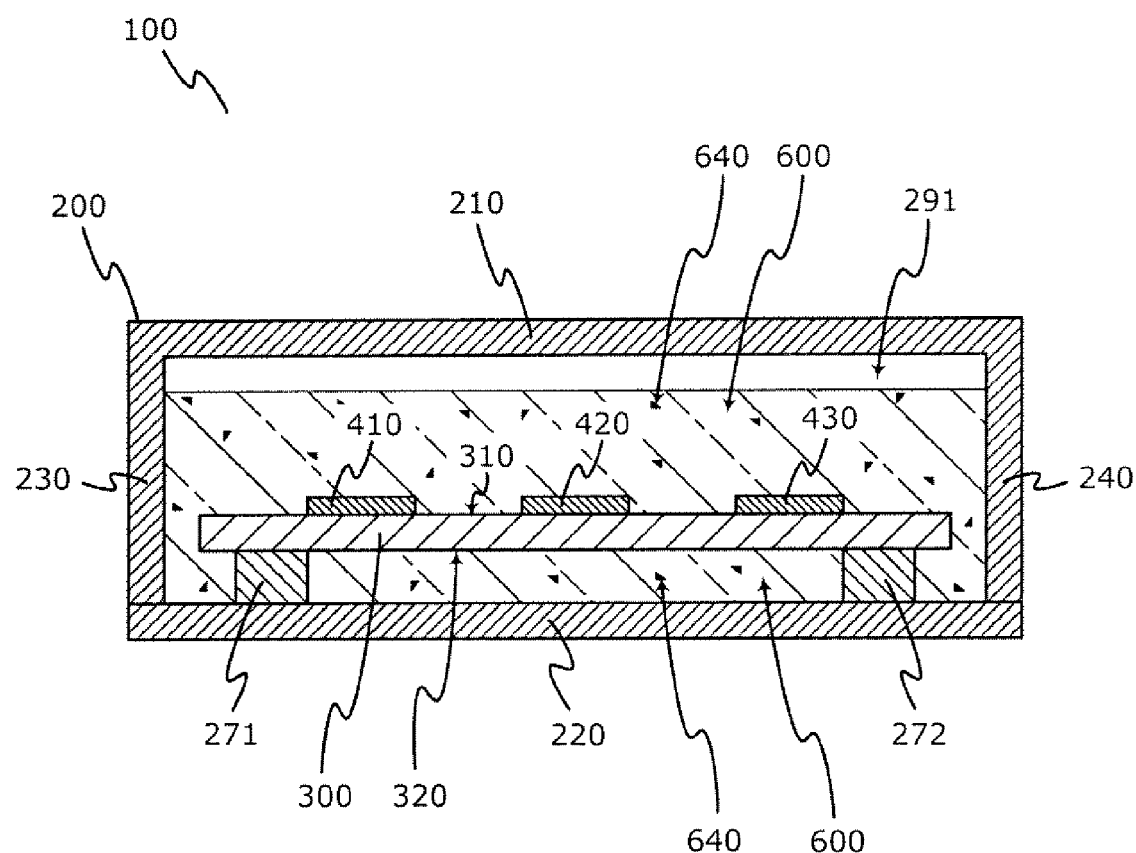

FIGS. 2A-2C illustrate one method of forming the thermal energy storage material in the electronic device 100. Beginning from FIG. 2A, the electronic device 100 comprises the housing 200 having a cavity 290 therein. The cavity 290 is defined by the top wall 210, sidewalls 230, 240 and bottom wall 220 of the housing 200. The circuit board 300 is disposed in the cavity 290, and a plurality of electronic components 410, 420, 430 are mounted on the circuit board.

In an embodiment of the present invention, the plurality of conductive particles 640 are added to the thermal energy storage material 600 before injecting the thermal energy storage material 600 into the housing 200. This can be done by heating the thermal energy storage material 600 into a liquid phase and adding the plurality of conductive particles 640 in solid form into the thermal energy storage material 600. In one embodiment, the plurality of conductive particles 640 are well mixed in the thermal energy storage material 600 so that the plurality of conductive particles 640 are evenly distributed in the thermal energy storage material 600. After mixing or distributing the plurality of conductive particles 640 in the thermal energy storage material 600, the thermal energy storage material 600 is injected into the cavity 290 through an orifice (not shown) of the housing 200. The thermal energy storage material 600 is injected into the housing 200 in a liquid phase or semi-solid phase to enable ease of flow into the housing 200.

In an embodiment of the present invention, the thermal energy storage material 600, in its liquid or semi-solid phase, is injected into the housing 200 until it fills up the entire cavity 290 as shown in FIG. 2B. In one embodiment the housing 200 comprises a vacuum hole to release pressure when the thermal energy storage material 600 is injected into the housing 200. The thermal energy storage material 600 is then allowed to cool and solidify. After cooling, the thermal energy storage material 600, in its solid phase, encapsulates the plurality of electronic components 410, 420, 430 on the circuit board.

In one embodiment after the thermal energy storage material 600 has solidified, a gap 291 is formed between top surface of the thermal energy storage material 600 and top wall 210 of the housing 200 as shown in FIG. 2C. The gap 291 is caused by the reduction in volume of the thermal energy storage material 600 when it converts from a liquid phase to a solid phase. Depending on the type of materials used, the thermal energy storage material 600 has about 5% to 10% reduction in volume when converting from a liquid phase to a solid phase.

In another embodiment the thermal energy storage material 600, in its liquid or semi-solid phase, is injected into the housing 200 shown in FIG. 2A but does not fill up the entire cavity 290. For example, the thermal energy storage material 600, in its liquid or semi-solid phase, only occupies 90% to 95% volume of the cavity 290, thus leaving a gap 294 between the between top surface of the thermal energy storage material 600 and top wall 210 of the housing 200 as shown in FIG. 2B'. After cooling, a gap 295 is formed between the solidified thermal energy storage material 600 and the housing 200, as illustrated in FIG. 2C. The gap 295 would be larger than gap 294 due to the reduction in volume of the thermal energy storage material 600 when it solidifies.

Figure 3A:
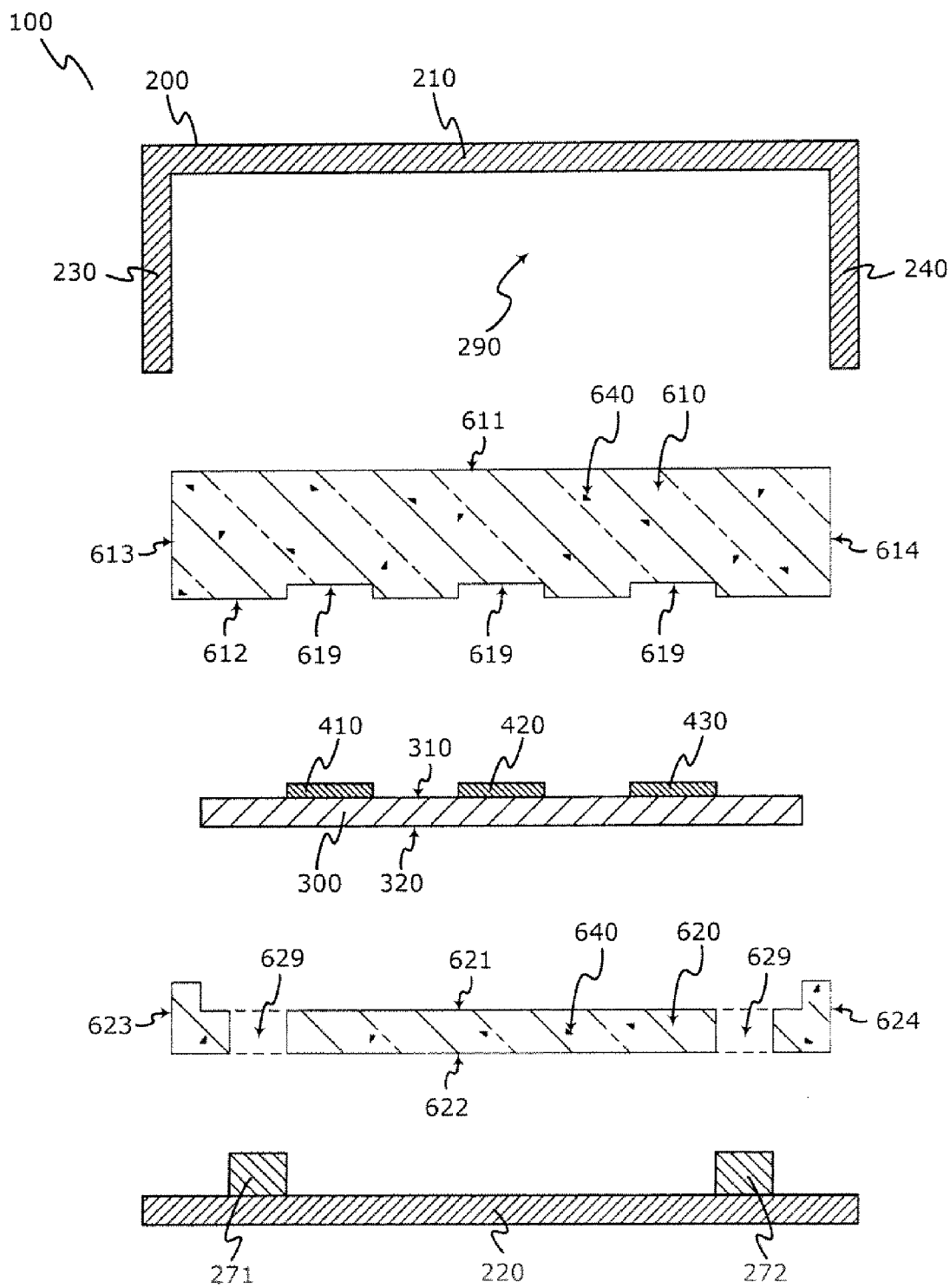
FIGS. 3A-3B are cross-sectional views that illustrate a method of forming the thermal energy storage material in the electronic device in accordance with another embodiment of the present invention.
Figure 3B:
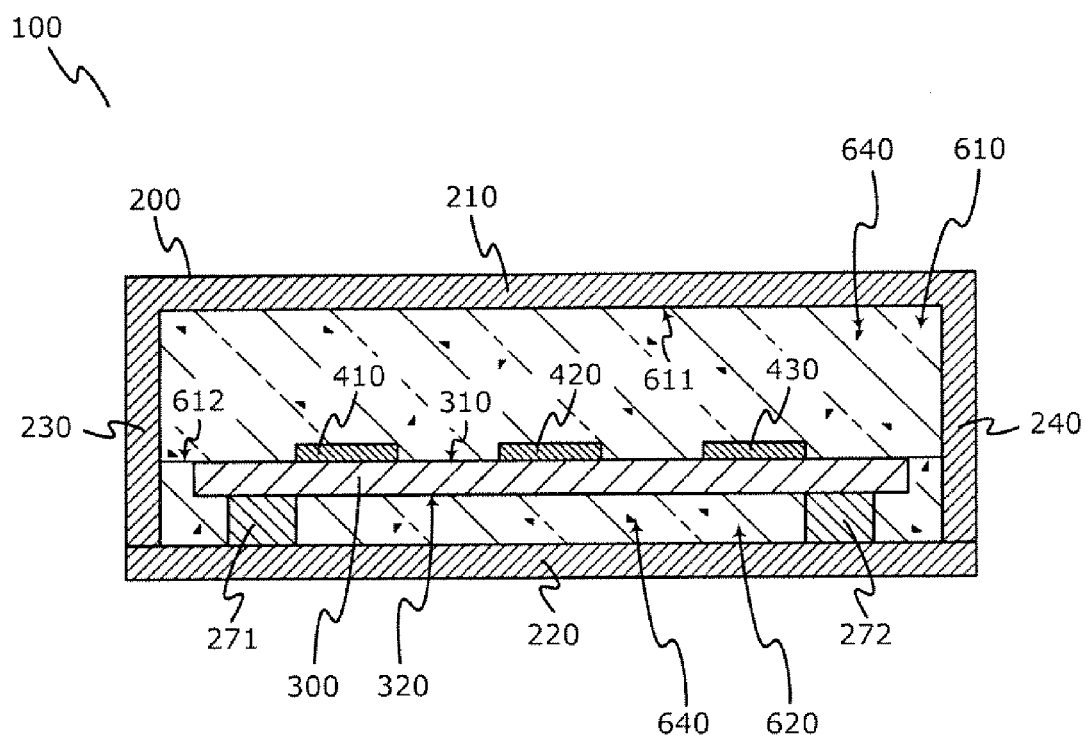

FIGS. 3A-3B illustrate another method of forming the thermal energy storage material in the electronic device 100. FIG. 3A illustrates an unassembled configuration of the electronic device 100. The electronic device 100 comprises a pre-formed thermal energy storage material having an upper portion 610 and a lower portion 620, wherein the upper portion 610 and lower portion 620 includes the plurality of conductive particles 640. In one embodiment, the upper and lower portions 610, 620, shown in FIG. 3A, are in their solid form.

In one embodiment, the upper portion 610 and lower portion 620 can be formed by any molding process well known in the art. For example, the thermal energy storage material is heated into a semi-solid or liquid phase so that the plurality of conductive particles 640 can be added and mixed with the thermal energy storage material. Then, the thermal energy storage material in its semi-solid or liquid phase is injected into a mold and allowed to solidify to form the upper and lower portions 610, 620.

In an embodiment of the present invention, the upper portion 610 have a top surface 611, a bottom surface 612 and sidewalls 613, 614 extending from the top surface 611 to the bottom surface 612. The bottom surface 612 includes a plurality of recesses 619 for encapsulating the plurality of electronic components 410, 420, 430. In one embodiment, the lower portion 620 comprises a top surface 621, a bottom surface 622 and sidewalls 623, 624 extending from the top surface 621 to the bottom surface 622. In a particular embodiment, the lower portion 620 comprises a plurality of openings 629 to allow the supports 271, 272 to extend through so that the circuit board 300 can be mounted on the supports 271, 272.

FIG. 3B illustrates an assembled configuration of the electronic device 100. In an embodiment of the present invention, the upper portion 610 is fabricated with sufficient thickness to fit between the top wall 210 of the housing and the upper surface 310 of the circuit board. In this case, the bottom surface 612 of the upper portion 610 is in direct contact with the plurality of electronic components 410, 420, 430 and the top surface 611 is direct contact with the top wall 210 of the housing 200. In an alternative embodiment, upper portion 610 is fabricated with a smaller thickness such that the top surface 611 of the upper portion 610 is not in direct contact with the top wall 210 of the housing 200. In other words, a gap (not shown) is formed between the top surface 611 and the top wall 210, similar to the embodiment described in relation to FIG. 2C.

In one embodiment, the lower portion 620 of the thermal energy storage material is fabricated with sufficient thickness to fit between the bottom wall 220 of the housing 200 and the bottom surface 320 of the circuit board 300. In this case, the bottom surface 622 of the lower portion 620 is in direct contact with the bottom wall 220 of the housing 200 and the top surface 621 is in direct contact with the bottom surface 320 of the circuit board 300. In an alternative embodiment, the lower portion 620 is fabricated with a smaller thickness such that a gap (not shown) exists between the bottom surface 622 of lower portion 620 and the bottom wall 220 of housing 200 or between the top surface 621 of lower portion and bottom surface 320 of circuit board 300.

Several embodiments of the invention have thus been described. However, those ordinarily skilled in the art will recognize that the invention is not limited to the embodiments described, but can be practiced with modification and alteration within the spirit and scope of the appended claims that follow.

We claim:

1. An electronic device comprising:
   a housing;
   a circuit board in the housing;
   a plurality of electronic components mounted on the circuit board, the plurality of electronic components including a radio module; and
   a thermal energy storage material in the housing to encapsulate the radio module, the thermal energy storage material having a first loss tangent parameter; and
   a plurality of conductive particles in the thermal energy storage material, the plurality of conductive particles to increase the first loss tangent parameter of the thermal energy storage material to a second loss tangent parameter, wherein the second loss tangent parameter is at least ten times the first loss tangent parameter.

2. The electronic device of claim 1, wherein the thermal energy storage material comprises hydrocarbon groups.

3. The electronic device of claim 1, wherein the plurality of conductive particles are made of metal or metal alloys.

4. The electronic device of claim 3, wherein the plurality of conductive particles have a volume concentration level ranging from 0.4 ppm to 1.0 ppm relative to the thermal energy storage material.

5. The electronic device of claim 1, wherein the radio module operates in a communication protocol selected from the group consisting of Bluetooth, UWB, WiFi and WiMax.

6. The electronic device of claim 1, wherein the housing is made of metal.

7. The electronic device of claim 1, wherein the housing is made of plastic, and wherein the housing includes an internal metal film.

8. The electronic device of claim 1, wherein the first loss tangent parameter is 0.0002 and the second loss tangent parameter is 0.002.

9. An electronic device comprising:
   a housing including a cavity;
   a circuit board in the cavity of the housing;
   a plurality of electronic components mounted on the circuit board;
   a thermal energy storage material in the cavity of the housing and over the plurality of electronic components, wherein the thermal energy storage material is to be doped with conductive ions having a concentration level of about 0.4 ppm to 1.0 ppm relative to the thermal energy storage material.

10. The electronic device of claim 9, wherein the housing comprises a top wall, a bottom wall, and a plurality of sidewalls extending from the periphery of the top wall to the periphery of the bottom wall.

11. The electronic device of claim 9, wherein the thermal energy storage material comprises an upper portion formed between the circuit board and the top wall of the housing.

12. The electronic device of claim 9, wherein the thermal energy storage material comprises a lower portion formed between the bottom surface of the circuit board and the bottom wall of the housing.

13. The electronic device of claim 9, wherein the thermal energy storage material is made of paraffin wax.

14. The electronic device of claim 9, wherein the conductive ions are selected from the group consisting of metal and iron.

15. The electronic device of claim 9, wherein the plurality of electronic components comprises a radio module operating in a communication protocol selected from the group consisting of Bluetooth, UWB, WiFi and WiMax.

16. A method of reducing radio frequency interference of an electronic device, the method comprising:
    providing a housing having a cavity;
    forming a thermal energy storage material in the cavity of the housing; and
    increasing the loss tangent of the thermal energy storage material by adding a plurality of conductive particles into the thermal energy storage material, wherein a second loss tangent parameter of the thermal energy storage material with the plurality of conductive particles is at least ten times a first loss tangent parameter of the thermal energy storage material without the plurality of conductive particles.

17. The method of claim 16, wherein forming the thermal energy storage material in the cavity of the housing comprises:
    heating the thermal energy storage material into a semi-solid or liquid phase; and
    injecting the semi-solid or liquid phase of the thermal energy storage material into the cavity of the housing.

18. The method of claim 16, wherein the plurality of conductive particles are made of metal or metal alloys.

19. The method of claim 16 wherein the plurality of conductive particles have a volume concentration level ranging from 0.4 ppm to 1.0 ppm relative to the thermal energy storage material.

20. The method of claim 16, wherein increasing the loss tangent of the thermal energy storage material comprises:
    doping the thermal energy storage material with conductives particles.

21. The method of claim 16, wherein the conductive particles are made of iron.

22. The method of claim 16, wherein the thermal energy storage material without the plurality of conductive particles has a first loss tangent parameter of approximately 0.0002 and the thermal energy storage material with the plurality of conductive particles has a second loss tangent parameter of approximately 0.002.

23. The method of claim 16, wherein forming the thermal energy storage material in the cavity of the housing comprises:
    molding the thermal energy storage material according to the shape of the cavity.

* * * * *